(12) United States Patent
Kim et al.

(10) Patent No.: US 7,750,393 B2
(45) Date of Patent: Jul. 6, 2010

(54) NON-VOLATILE MEMORY DEVICE WITH INDEPENDENT CHANNEL REGIONS ADJACENT DIFFERENT SIDES OF A COMMON CONTROL GATE

(75) Inventors: Won-joo Kim, Yongin-si (KR); Yoon-dong Park, Yongin-si (KR); June-mo Koo, Yongin-si (KR); Suk-pil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 80 days.

(21) Appl. No.: 11/987,008

(22) Filed: Nov. 26, 2007

(65) Prior Publication Data
US 2008/0135916 A1    Jun. 12, 2008

(30) Foreign Application Priority Data
Nov. 28, 2006   (KR) ...................... 10-2006-0118558

(51) Int. Cl.
H01L 29/788    (2006.01)
H01L 29/792    (2006.01)
(52) U.S. Cl. ............... 257/316; 257/324; 257/E21.428; 257/E29.3
(58) Field of Classification Search .................. 257/316, 257/E21.428, E29.3, 324
See application file for complete search history.

(56) References Cited

U.S. PATENT DOCUMENTS

| | | | | |
|---|---|---|---|---|
| 5,179,427 | A * | 1/1993 | Nakayama et al. | 257/211 |
| 6,627,943 | B2 * | 9/2003 | Shin et al. | 257/315 |
| 2005/0253185 | A1 * | 11/2005 | Smith | 257/316 |

* cited by examiner

*Primary Examiner*—Howard Weiss
(74) *Attorney, Agent, or Firm*—Harness, Dickey & Pierce, P.L.C.

(57) ABSTRACT

Provided are example embodiments of a non-volatile memory device and a method of fabricating the same. The non-volatile memory device may include a control gate electrode arranged on a semiconductor substrate, a gate insulating layer interposed between the semiconductor substrate and the control gate electrode, a storage node layer interposed between the gate insulating layer and the control gate electrode, a blocking insulating layer interposed between the storage node layer and the control gate electrode, first dopant doping regions along a first side of the control gate electrode, and second dopant doping regions along a second side of the control gate electrode. The first dopant doping regions may alternate with the second dopant doping regions. Stated differently, each of the second dopant doping regions may be arranged in a region on the second side of the control gate electrode that is adjacent to one of the first dopant doping regions.

13 Claims, 11 Drawing Sheets

NON-VOLATILE MEMORY DEVICE WITH INDEPENDENT CHANNEL REGIONS ADJACENT DIFFERENT SIDES OF A COMMON CONTROL GATE

PRIORITY STATEMENT

This application claims the benefit of Korean Patent Application No. 10-2006-0118558, filed on Nov. 28, 2006, in the Korean Intellectual Property Office, the entire contents of which is incorporated herein by reference.

BACKGROUND

1. Field

Example embodiments relate to a semiconductor device, and more particularly, to a non-volatile memory device including a storage node layer for storing charges and a method of fabricating the same.

2. Description of the Related Art

FIG. 1 is a plan view of a conventional non-volatile memory device. Referring to FIG. 1, the non-volatile memory device includes buried bit line regions 55 and control gate electrodes 70 which extend across the buried bit line regions 55. Dopant may be doped in a semiconductor substrate 50 to define the buried bit line regions 55. Since an isolation layer in a cell region is not required in a non-volatile memory device as shown in FIG. 1, the non-volatile memory device may have a relatively small size.

However, the buried bit line regions 55 in conventional non-volatile memory devices generally have higher resistances than metal lines. Thus, the resistances of the buried bit line regions 55 are relatively high in an array structure in which the buried bit line regions 55 have long lengths. Therefore, the buried bit line regions 55 arranged beside the control gate electrodes 70 are connected to metal lines through contact structures 60. However, the contact structures 60 increase the size of the non-volatile memory device and thus, reduce the integration of the conventional non-volatile memory device as shown in FIG. 1.

Further, if distances between the buried bit line regions 55 are shortened, the integration of the non-volatile memory device may be increased. However, in this case, the reliability of the conventional non-volatile memory device is significantly decreased due to a short channel effect.

SUMMARY

Example embodiments provide a non-volatile memory device that may be highly integrated and reliable, and a method of fabricating the non-volatile memory device.

An example embodiment provides a non-volatile memory device. The non-volatile memory device may include a first control gate electrode recessed into a semiconductor substrate; a gate insulating layer interposed between the semiconductor substrate and the control gate electrode; a storage node layer interposed between the gate insulating layer and the control gate electrode; a blocking insulating layer interposed between the storage node layer and the control gate electrode; a plurality of first dopant doping regions disposed along a first side of the first control gate electrode; and a plurality of second dopant doping regions disposed along a second side of the first control gate electrode opposite to the first side. According to an example embodiment the second dopant doping regions alternate with the first dopant doping regions. Stated differently, each of the second dopant doping regions are arranged in a region on the second side of the control gate electrode that is adjacent to at least one of the first dopant doping regions.

According to an example embodiment, the non-volatile memory device may further include a plurality of first bit line electrodes and a plurality of second bit line electrodes. Each of the plurality of first bit line electrodes may include at least one first plug portion recessed into one of the first dopant doping regions. Each of the plurality of second bit line electrodes may include at least one second plug portions recessed into one of the second dopant doping regions.

According to an example embodiment, the non-volatile memory device may further include a buried insulating layer interposed between a bottom of the control gate electrode and the semiconductor substrate. The thickness of the buried insulating layer is greater than the thickness of the gate insulating layer.

According to an example embodiment, the non-volatile memory device may also include a second control gate electrode formed on the control gate electrode to be recessed into the semiconductor substrate; the second control gate electrode being insulated from the first control gate electrode.

Another example embodiment provides a non-volatile memory device. The non-volatile memory device may include a plurality of control gate electrodes recessed into a semiconductor substrate; a gate insulating layer interposed between the semiconductor substrate and the control gate electrodes; a storage node layer interposed between the gate insulating layer and the control gate electrodes; a blocking insulating layer interposed between the storage node layer and the control gate electrodes; a plurality of first dopant doping regions disposed along first sides of the control gate electrodes and defined in the semiconductor substrate; and a plurality of second dopant doping regions alternating with the first dopant doping regions along second sides of the control gate electrodes opposite to the first sides and defined in the semiconductor substrate.

Still another example embodiment provides a method of fabricating a non-volatile memory device. The method may include forming a first trench in a semiconductor substrate; forming a gate insulating layer in the first trench; forming a storage node layer covering the gate insulating layer; forming a blocking insulating layer covering the storage node layer; forming a control gate electrode on the blocking insulating layer to fill at least a portion of the first trench; forming a plurality of first dopant doping regions along a first side of the control gate electrode; and forming a plurality of second dopant doping regions in the semiconductor substrate along a second side of the control gate electrode opposite to the first side, each of the plurality of second dopant doping regions being formed in a region on the second side that is adjacent to at least one of the plurality of first dopant doping regions along the first side.

BRIEF DESCRIPTION OF THE DRAWINGS

The above and other features, aspects and advantages of example embodiments will become more apparent from a review of the detailed description, which refers to the attached drawings in which.

DETAILED DESCRIPTION OF EXAMPLE EMBODIMENTS

Figure 1:
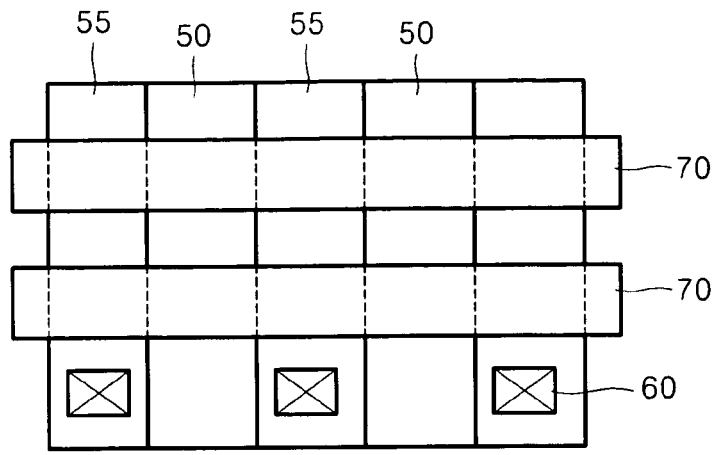
FIG. 1 is a plan view of a conventional non-volatile memory device.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of the example embodiments to those skilled in the art. In the drawings, like numbers refer to like elements throughout. Further, the thicknesses of layers and regions are exaggerated for clarity in the drawings. Still further, in the example embodiments described below, a non-volatile memory device may be a flash memory device.

Figure 2:
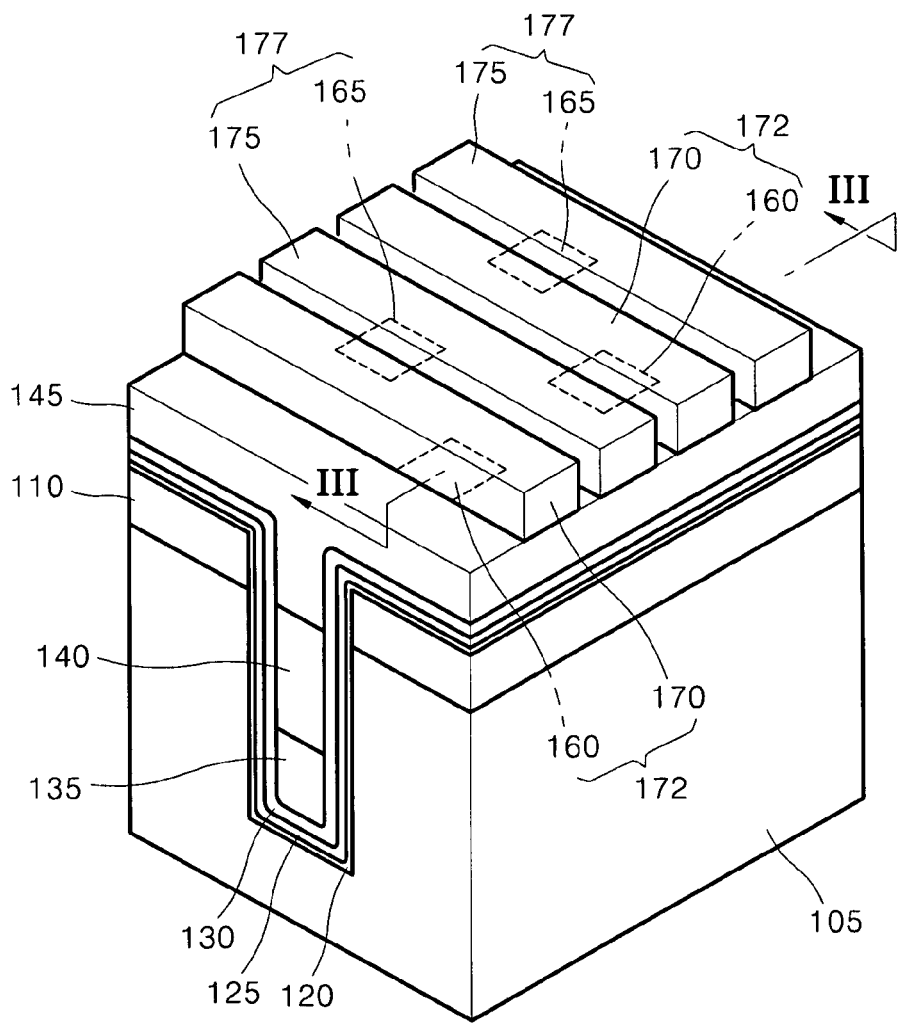
FIG. 2 is a perspective view of an example embodiment of a non-volatile memory device.
Figure 3:
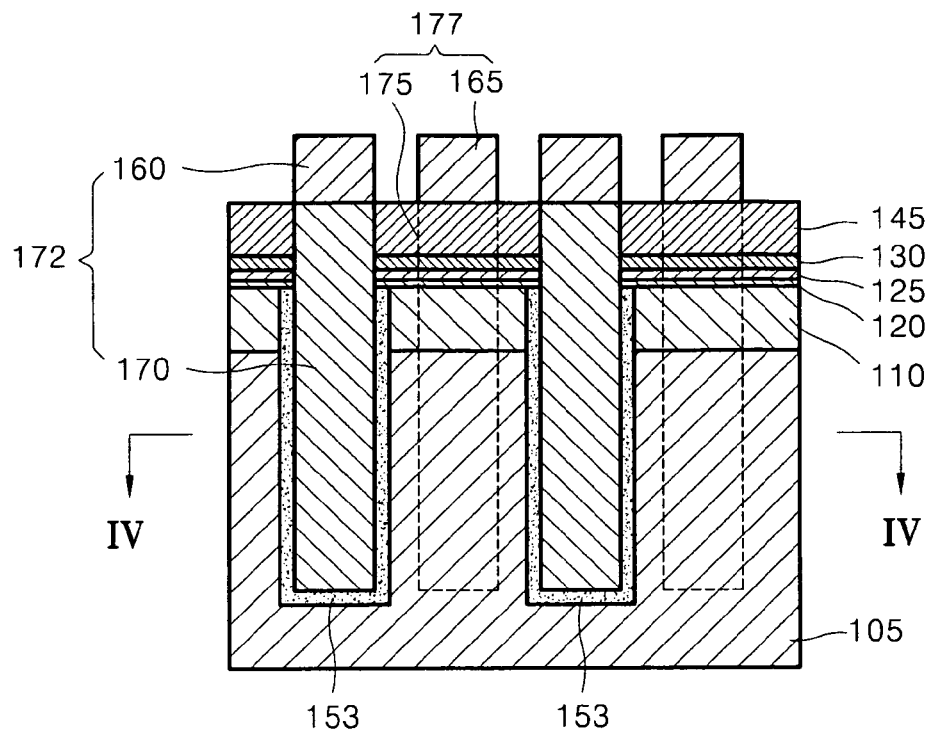
FIG. 3 is a cross-sectional view of the non-volatile memory device of FIG. 2 taken along a line III-III' of FIG. 2.
Figure 4:
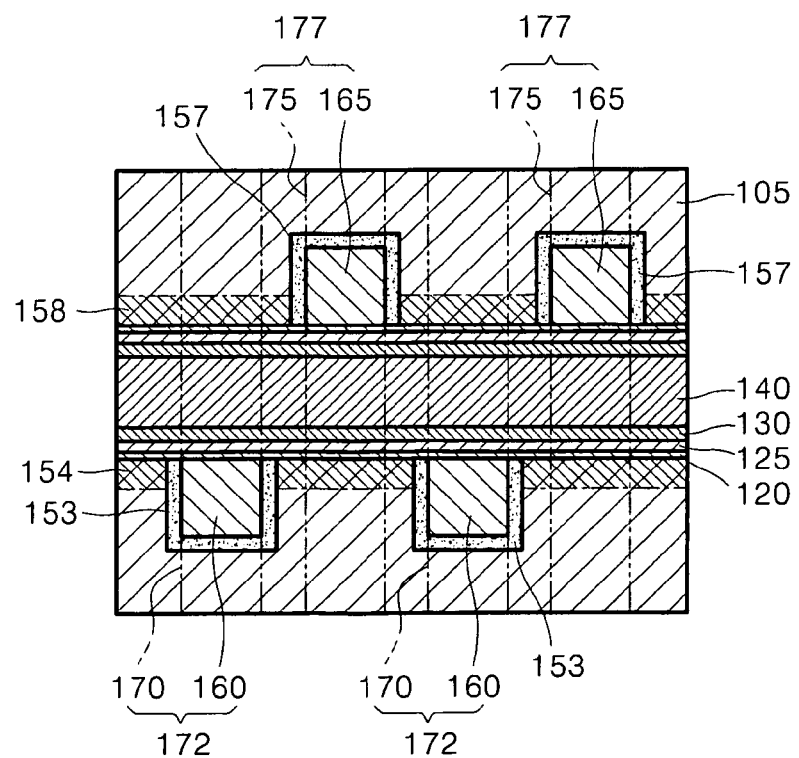
FIG. 4 is a plan view of the non-volatile memory device of FIG. 2 taken along a line IV-IV' of FIG. 3.

FIG. 2 is a perspective view of an example embodiment of a non-volatile memory device, FIG. 3 is a cross-sectional view of the non-volatile memory device taken along a line III-III' of FIG. 2, and FIG. 4 is a plan view of the non-volatile memory device taken along a line IV-IV' of FIG. 3.

Referring to FIGS. 2 through 4, a gate electrode 140 may be recessed in a semiconductor substrate 105. A gate insulating layer 120 may be interposed between the semiconductor substrate 105 and the control gate electrode 140. A storage node layer 125 is interposed between the gate insulating layer 120 and the control gate electrode 140. A blocking insulating layer 130 may be interposed between the storage node layer 125 and the control gate electrode 140. First dopant doping regions 153 may be disposed along a first side of the control gate electrode 140, and second dopant doping regions 157 may be disposed along a second side of the control gate electrode 140.

In the example embodiment of the non-volatile memory device shown in FIGS. 2 through 4, the control gate electrode 140 may be used as a part of a word line. Thus, the control gate electrode 140 may be controlled to store data in the storage node layer 125 or erase data from the storage node layer 125. Two adjacent first dopant doping regions 153 and the control gate electrode 140 may form a memory transistor or a unit cell. Also, two adjacent second dopant doping regions 157 and the control gate electrode 140 may form a memory transistor or a unit cell. Thus, the first dopant doping regions 153 may be sequentially called source regions or drain regions, and the second dopant doping regions 157 may be sequentially called source regions or drain regions.

First channel regions 154 may be arranged along the first side of the control gate electrode 140 and may be located and/or defined between every two adjacent first dopant doping regions 153 in the semiconductor substrate 105. Similarly, second channel regions 158 may be arranged along the second side of the control gate electrode 140 and may be located and/or defined between every two adjacent second dopant doping regions 157. In other words, the first and second channel regions 154 and 158 may be located and/or defined along the first and second sides of the control gate electrode 140, respectively. The first and second channel regions 154 and 158 are regions in which channels are to be formed when a memory transistor is activated.

For example, FIGS. 1 through 3 may illustrate a cell region of a non-volatile memory device. An isolation layer may not be interposed between unit cells in the cell region of the non-volatile memory device. However, an isolation layer may be formed in a peripheral region outside the cell region. Because the isolation layer may be omitted in the cell region as described above, integration of an example embodiment of the non-volatile memory device may be improved as compared to conventional non-volatile memory devices.

According to an example embodiment, the semiconductor substrate 105 may be a bulk semiconductor wafer, e.g., a silicon wafer, a germanium wafer, or a silicon-germanium wafer. As illustrated in FIGS. 1 and 2, the control gate electrode 140 is recessed into the semiconductor substrate 105 and thus may be referred to as a recess type or trench type control gate electrode. However, as indicated above, the example embodiment illustrated in FIGS. 1 and 2, or any of the other example embodiments, do not limit the scope of this disclosure.

The control gate electrode 140 may be recessed from a surface of the semiconductor substrate 105 into an interior of the semiconductor substrate 105 to a desired and/or predetermined depth according to an example embodiment. However, according to another example embodiment, the control gate electrode 140 may include a portion protruding from the surface of the semiconductor substrate 105 or may be buried in the semiconductor substrate 105. The first and second sides of the control gate electrode 140 may refer to the longitudinal sides of the control gate electrode 140 based on the plan view of the non-volatile memory device taken along the line IV-IV' of FIG. 3.

The control gate electrode 140 may be insulated from the semiconductor substrate 105. For example, the control gate electrode 140 may be insulated from the semiconductor substrate 105 by the gate insulating layer 120. A buried insulating layer 135 may be selectively further interposed between a bottom of the control gate electrode 140 and the semiconductor substrate 105. In more detail, the buried insulating layer 135 may be formed on the blocking insulating layer 130. The buried insulating layer 135 may be thicker than the gate insulating layer 120, and thus a channel may not be formed in a portion of the semiconductor substrate 105 underneath the control gate electrode 140. The buried insulating layer 135 may include an oxide layer, for example.

The gate insulating layer 120 may allow tunneling of charges, and thus may include, for example, an oxide layer, a nitride layer, and/or a high dielectric constant layer. The blocking insulating layer 130 may inhibit movement of charges between the storage node layer 125 and the control gate electrode 140, and thus may include, for example, an oxide layer, a nitride layer, and/or a high dielectric constant layer. According to an example embodiment, the high dielectric constant layer may be defined as an insulating layer having a greater dielectric constant than the oxide layer and the nitride layer.

The storage node layer 125 may store charges and include, for example, a silicon nitride layer, metal or silicon dots, and/or metal or silicon nano-crystals. In particular, the storage node layer 125 may locally trap charges.

According to an example embodiment, the gate insulating layer 120, the storage node layer 125, and the blocking insulating layer 130 may be interposed between the first and second sides of the control gate electrode 140 and the semiconductor substrate 105 and may extend onto the semiconductor substrate 105. However, portions of the gate insulating layer 120, the storage node layer 125, and the blocking insulating layer 130 extending onto the semiconductor substrate 105 may be omitted according to another example embodiment. Further, each of the gate insulating layer 120, the storage node layer 125, and the blocking insulating layer 130 may be divided into two portions by the control gate electrode 140.

A mask insulating layer 110 may be interposed between the gate insulating layer 120 and an upper surface of the semiconductor substrate 105 according to an example embodiment. However, according to another embodiment, the mask insulating layer 110 may be replaced with another appropriate insulating layer or may be omitted.

Dopant may be doped into the semiconductor substrate 105 to form the first and second dopant doping regions 153 and 157 according to an example embodiment. For example, if the semiconductor substrate 105 is doped with p-type dopant, the first and second dopant doping regions 153 and 157 may be doped with n-type dopant. Alternatively, if the semiconductor substrate 105 is doped with n-type dopant, the first and second dopant doping regions 153 and 157 may be doped with p-type dopant. The first and second dopant doping regions 153 and 157 may extend from the surface of the semiconductor substrate 105 to desired and/or predetermined depths. The first dopant doping regions 153 may be adjacent to the first side of the control gate electrode 140, and the second dopant doping regions 157 may be adjacent to the second side of the control gate electrode 140.

The first dopant doping regions 153 may alternate with the second dopant doping regions 157. As such, one of the second dopant doping regions 157 may be disposed between two adjacent first dopant doping regions 153. Stated differently, each of the second dopant doping regions 157 may be arranged in a region on the second side of the control gate electrode 140 that is adjacent to at least one of the plurality of first dopant doping regions 153. Further restated, each of the second dopant doping regions 157 may be arranged on the second side of the control gate electrode 140 and across from a region on the first side of the control gate electrode 140 that is interposed between two adjacent first dopant doping regions 153. Further, the first and second dopant doping regions 153 and 157 may be disposed at the same distance, and thus, each of the second dopant doping regions 157 may be disposed between two first dopant doping regions 153.

The first dopant doping regions 153 may alternate with the second dopant doping regions 157 near opposite sides of the control gate electrode 140. The first dopant doping regions 153 may alternate with the second dopant doping regions 157 in the direction in which the control gate electrode 140 extends. Thus, integration of the non-volatile memory device according to an example embodiment may be double that of the conventional non-volatile memory device illustrated in FIG. 1. Furthermore, a short channel effect can be improved. In other words, in the non-volatile memory device according to an example embodiment, may include two unit cells the amount of space occupied by a single unit cell of the conventional non-volatile memory device illustrated in FIG. 1. Since the first dopant doping regions 153 alternate with the second dopant doping regions 157 according to an example embodiment, widths of the first channel regions 154 between the first dopant doping regions 153 and the second channel regions 158 between the second dopant doping regions 157 may be kept relatively wide. The improvement of the short channel effect significantly contributes to improving the reliability of an example embodiment of a non-volatile memory device as compared to conventional non-volatile memory devices.

The first dopant doping regions 153 may be connected to a plurality of first bit line electrodes 172, and the second dopant doping regions 157 may be connected to a plurality of second bit line electrodes 177 according to an example embodiment. For example, the first bit line electrodes 172 may include first plug portions 160 and first line portions 170, and the second bit line electrodes 177 may include second plug portions 165 and second line portions 175.

The first plug portions 160 may be recessed into the first dopant doping regions 153, and the second plug portions 165 may be recessed into the second dopant doping regions 157. The first line portions 170 may be connected to the first plug portions 160, and the second line portions 175 may be connected to the second plug portions 165. Further, the first and second line portions 170 and 175 may extend across the control gate electrode 140. Depths of the first and second plug portions 160 and 165 may be modified within a range of being defined in the first and second dopant doping regions 153 and 157.

According to an example embodiment, the first and second plug portions 160 and 165 may include, for example, polysilicon, metal, and/or metal silicide; and the first and second line portions 170 and 175 may include, for example, polysilicon, metal, and/or metal silicide. In this case, the first and second bit line electrodes 172 and 177 may have very low electrical resistances compared to conventional buried bit line regions. An interlayer insulating layer 145 may be interposed between the semiconductor substrate 105 and the first and second bit line electrodes 172 and 177 according to an example embodiment.

In the non-volatile memory device according to an example embodiment, two adjacent first bit line electrodes 172 or two adjacent second bit line electrodes 177 may be selected to address a unit cell. For example, charges of the first or second channel regions 154 or 158 may be injected into the storage node layer 125 using a hot carrier injection method to perform a program operation. The storage node layer 125 may be used as a local charge trap layer. Thus, unit cells may change a direction of a current flowing in the first channel regions 154 or a direction of a current flowing in the second channel regions 157 to process 2-bit data.

It is obvious that reading and erasing operations may be easily performed according to a method known by those of ordinary skill in the art and thus, these reading and erasing operations will not be further discussed in this disclosure for the sake of brevity.

Figure 5:
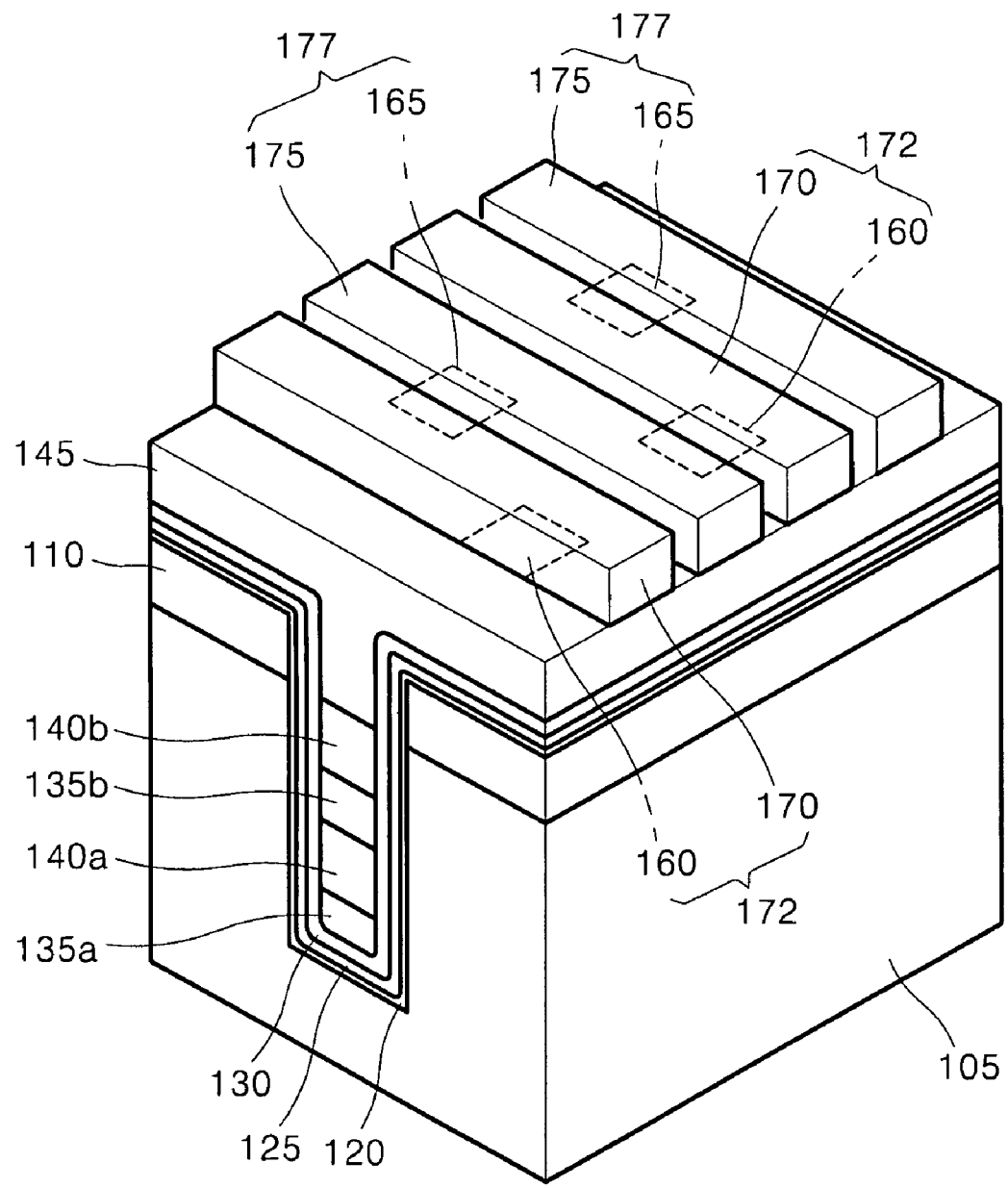
FIG. 5 is a perspective view of another example embodiment of a non-volatile memory device.

FIG. 5 is a perspective view of a non-volatile memory device according to another example embodiment. The non-volatile memory device illustrated in FIG. 5 is the same as the non-volatile memory device illustrated in FIGS. 1 through 3 except that a control gate electrode in the non-volatile memory device of FIG. 5 has a two-layer structure. Thus, descriptions of elements common to the example embodiment illustrated in FIGS. 1 through 3 and the example embodiment illustrated in FIG. 5 are not repeated for the sake of brevity.

Referring to FIG. 5, lower and upper control gate electrodes 140a and 140b are recessed into a semiconductor substrate 105 to be sequentially stacked. A lower buried insulating layer 135a may be interposed between a bottom of the lower control gate electrode 140a and the semiconductor substrate 105, and an upper buried insulating layer 135b may be interposed between the lower and upper control gate electrodes 140a and 140b.

In the example embodiment of the non-volatile memory device illustrated in FIG. 5, charges may be locally stored in a storage node layer 125 adjacent to first and second sides of the lower and upper control gate electrodes 140a and 140b. Thus, integration of the non-volatile memory device illustrated in FIG. may be double that of the non-volatile memory device illustrated in FIGS. 1 through 3.

Figure 6:
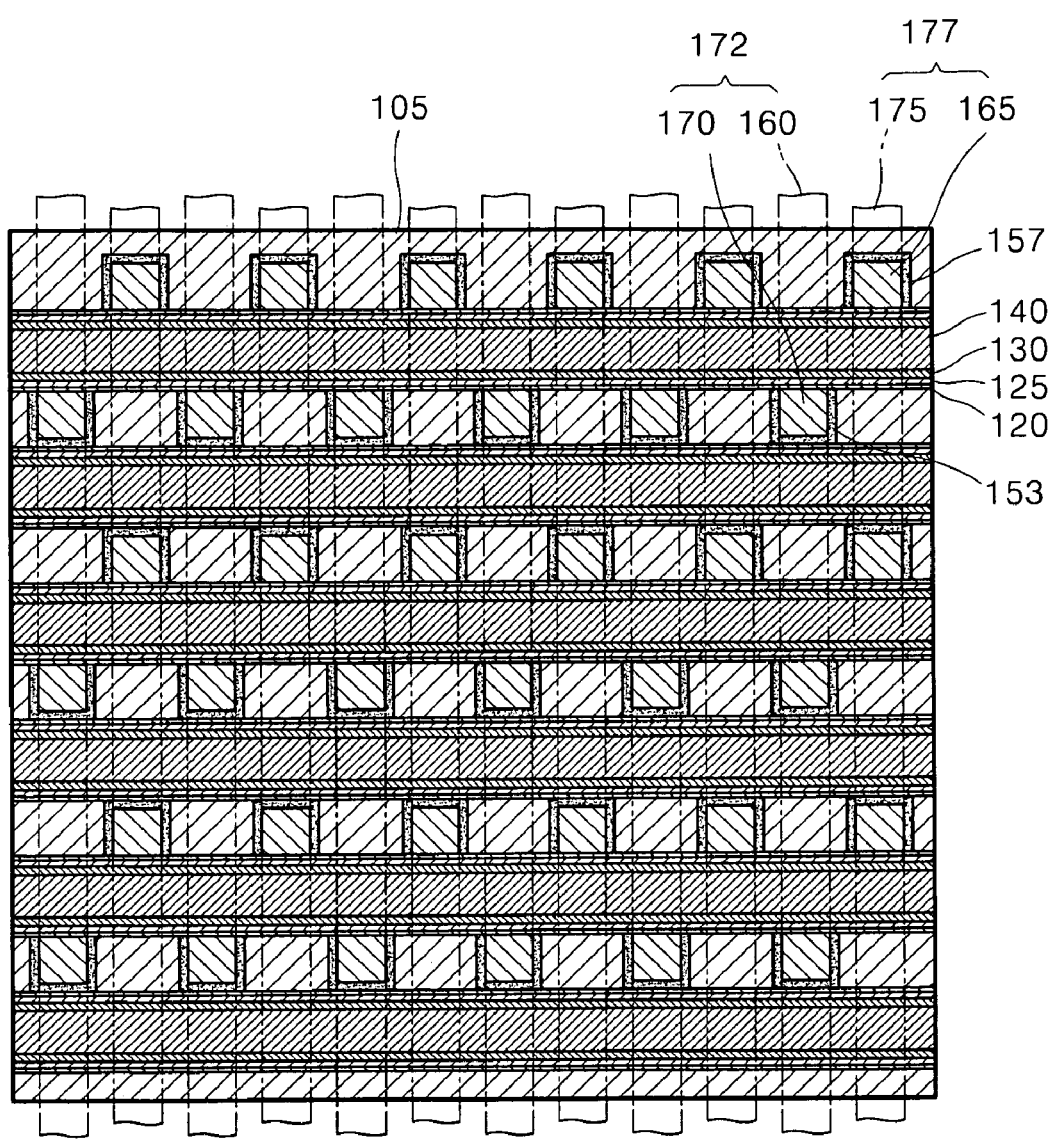
FIG. 6 is a plan view of still another example embodiment of a non-volatile memory device.

FIG. 6 is a plan view of a non-volatile memory device according to yet another example embodiment. This example embodiment of the non-volatile memory device may have a structure in which a plurality of non-volatile memory devices as illustrated in FIGS. 1 through 3 are arrayed and thus, the number of control gate electrodes is increased. It should be understood by one skilled in the art that the non-volatile memory device of FIG. 6 has a structure in which a plurality of non-volatile memory devices as illustrated in FIG. 3 are repeatedly arrayed. Thus, descriptions of similar elements in the previously described example embodiments are not repeated for the sake of brevity.

Referring to FIG. 6, a plurality of control gate electrodes 140 are disposed at desired and/or predetermined distances from one another. The control gate electrodes 140 are recessed in a semiconductor substrate 105. First dopant doping regions 153 are located and/or defined in the semiconductor substrate 105 along first sides of the control gate electrodes 140, and second dopant doping regions 157 are located and/or defined in the semiconductor substrate 105 along second sides of the control gate electrodes 140.

For example, the first dopant doping regions 153 may be disposed in a plurality of rows along the first sides of the control gate electrodes 140, and the second dopant doping regions 157 may be disposed in a plurality of rows along the second sides of the control gate electrodes 140. The first dopant doping regions 153 alternate with the second dopant doping regions 157 near opposite sides of the control gate electrodes 140 in the direction in which the control gate electrodes 140 extend.

First bit line electrodes 172, including first line portions 170 and first plug portions 160, may connect the first dopant doping regions 153 disposed in the same column. In other words, the first line portions 170 may extend across the control gate electrodes 140 to connect the first plug portions 160 disposed in the same column. Similarly, second bit line electrodes 177, including second line portions 175 and second plug portions 165, may connect the second dopant doping regions 157 disposed in the same column. In other words, the second line portions 175 may extend across the control gate electrodes 140 to connect the second plug portions 165 disposed in the same column.

The example embodiment of the non-volatile memory device illustrated in FIG. 6 may be referred to as a NOR structure or an AND structure. In other words, two of the first bit line electrodes 172 or two of the second bit line electrodes 177 may be selected, and one of the control gate electrodes 140 may be selected to operate a unit cell. In the NOR structure, the first and second bit line electrodes 172 and 177 disposed in odd-numbered or even-numbered rows may be grounded.

Figure 7:
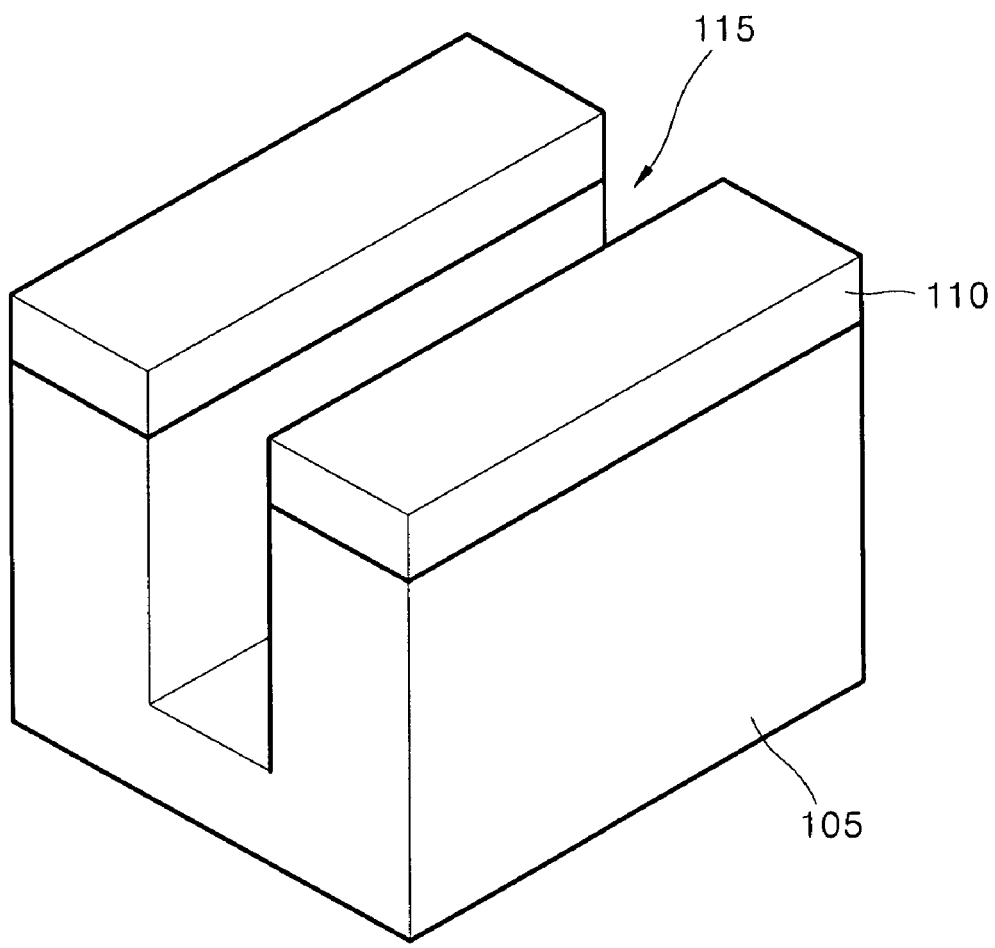
FIGS. 7 through 13 are perspective views illustrating an example embodiment of a method of fabricating a non-volatile memory device.

FIGS. 7 through 13 are perspective views illustrating an example embodiment of a method of fabricating a non-volatile memory device. Referring to FIG. 7, a mask insulating layer 110 is formed on a semiconductor substrate 105. The mask insulating layer 110 may include a nitride layer, for example. The mask insulating layer 110 may be used as an etching protecting layer to etch an exposed portion of the semiconductor substrate 105 so as to form a first trench 115.

Figure 8:
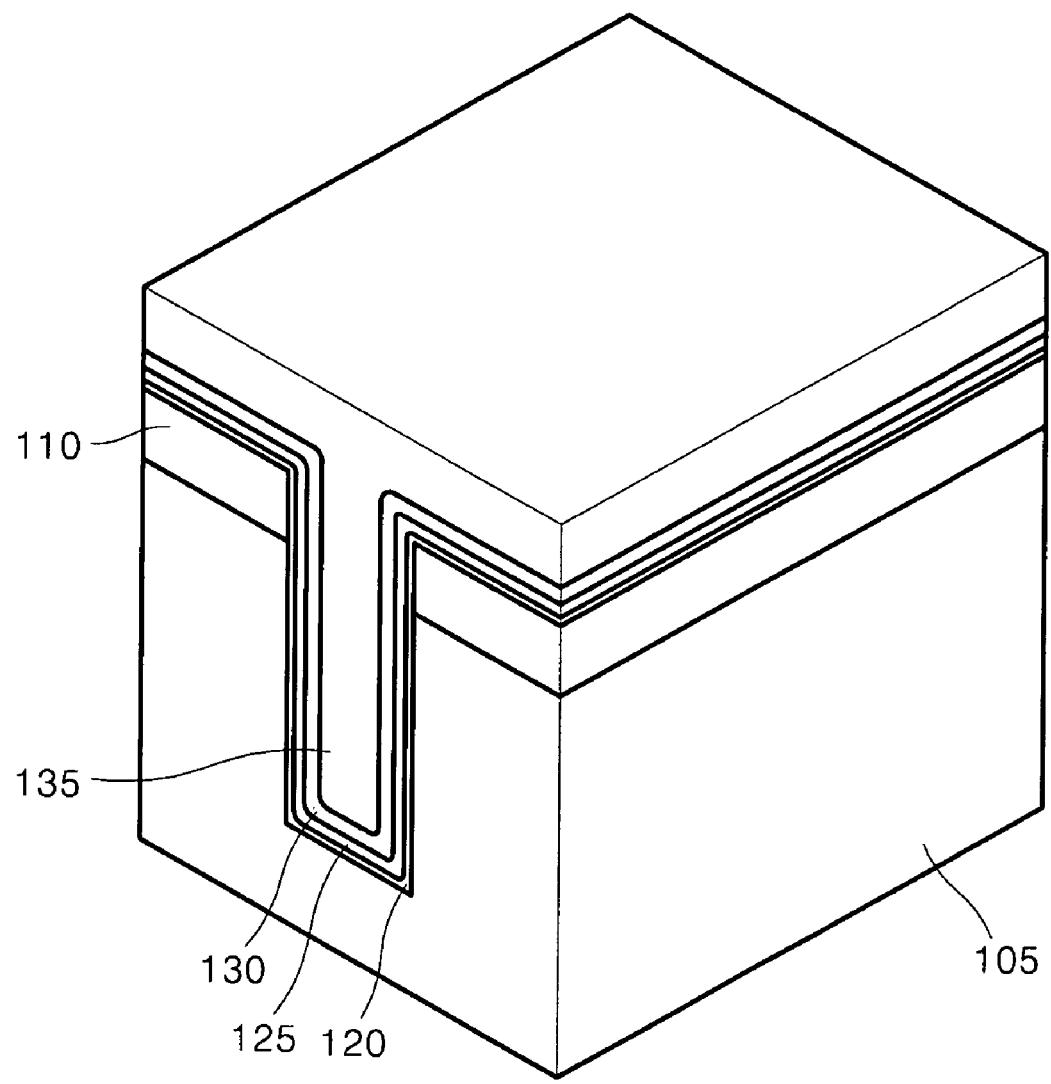

Referring to FIG. 8, a gate insulating layer 120 is formed on the exposed portion of the semiconductor substrate 105 in the first trench 115. The gate insulating layer 120 may be formed using a thermal oxidation method or a chemical vapor deposition (CVD) method, for example. The gate insulating layer 120 may extend onto the mask insulating layer 110 according to an example embodiment.

A storage node layer 125 is formed on the gate insulating layer 120. The thickness of the storage node layer 125 may be controlled so that the storage node layer 125 does not completely fill the first trench 115. A blocking insulating layer 130 is formed on the storage node layer 125. The storage node layer 125 and the blocking insulating layer 130 may be formed using a CVD method, for example.

A buried insulating layer 135 is formed on the blocking insulating layer 130 to fill the first trench 115 according to an example embodiment. The buried insulating layer 135 may be formed to a desired and/or predetermined thickness using a CVD method, for example. The buried insulating layer 135 may then be planarized. The buried insulating layer 135 may have etching selectivity with respect to the blocking insulating layer 130. For example, if the blocking insulating layer 130 includes a nitride layer or a high dielectric constant layer, the buried insulating layer 135 may include an oxide layer.

Figure 9:
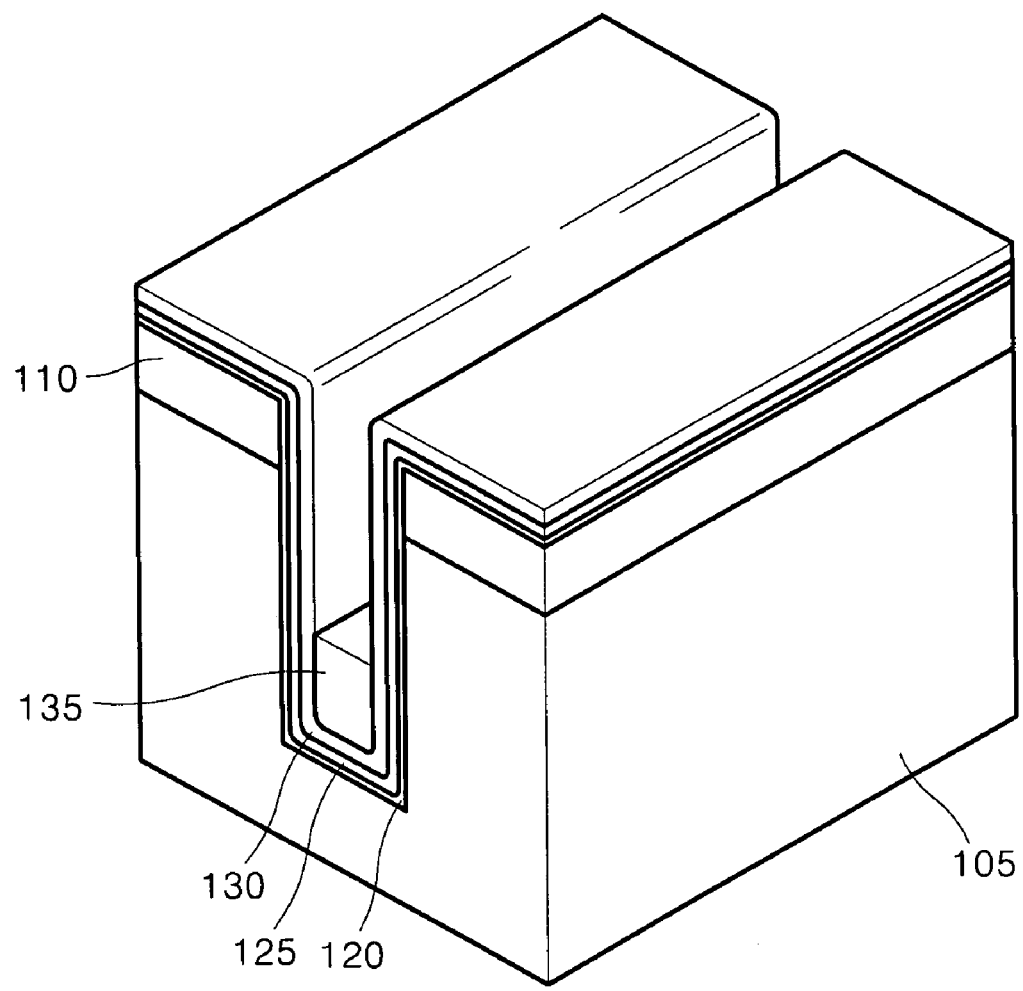

Referring to FIG. 9, the buried insulating layer 135 is selectively etched to define the buried insulating layer 135 in a lower part of the first trench 115. The buried insulating layer 135 may be dry or wet etched. The buried insulating layer 135 may be thicker than the gate insulating layer 120 so that a channel is not formed in a portion of the semiconductor substrate 105 underneath a bottom of the first trench 115 according to an example embodiment.

Figure 10:
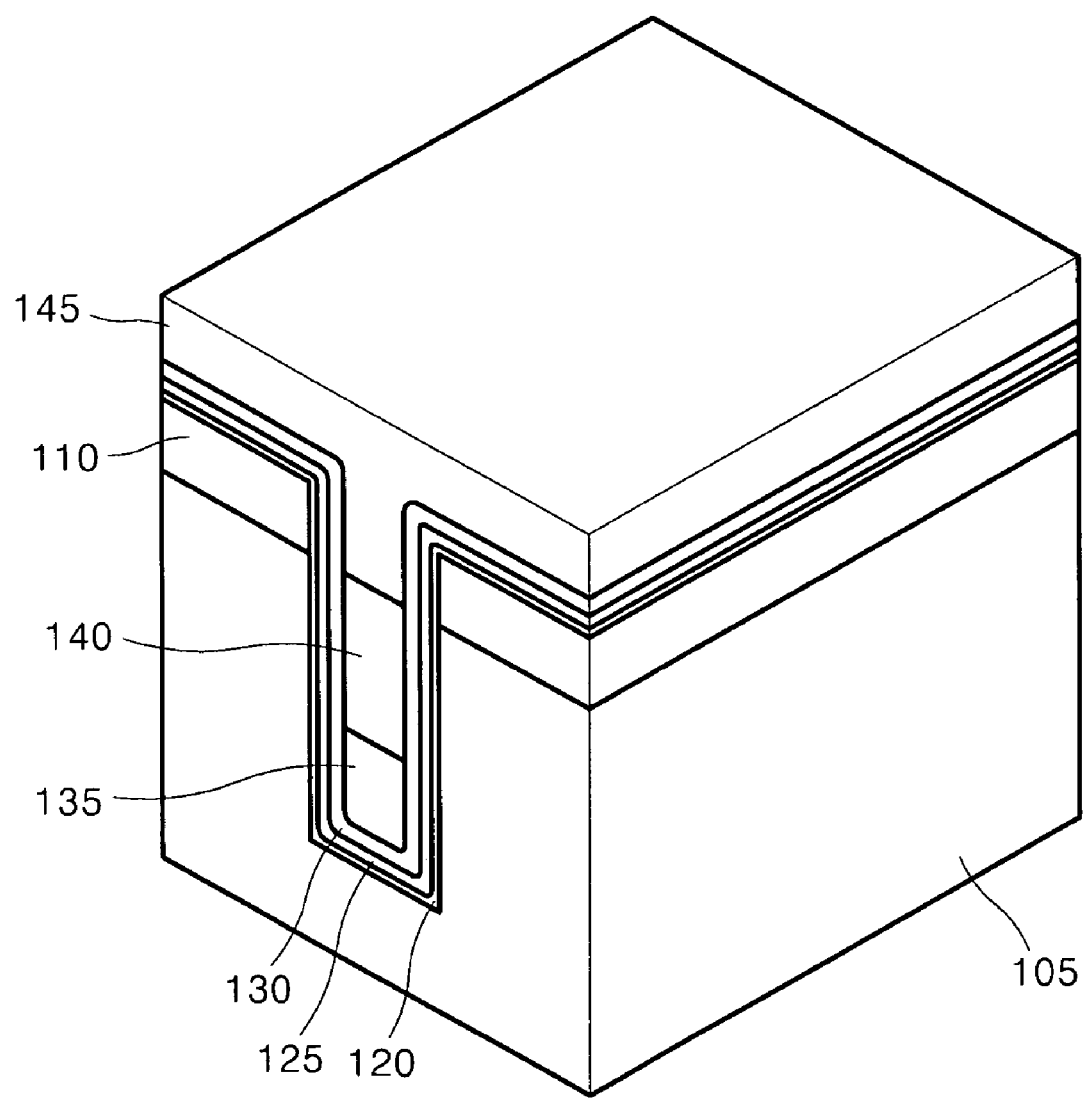

Referring to FIG. 10, a control gate electrode 140 is formed on the buried insulating layer 135 to fill at least a portion of the first trench 115. For example, a conductive layer may be formed to fill the first trench 115 and then planarized or etched to a desired and/or appropriate height so as to form the control gate electrode 140.

As illustrated in FIG. 10, an interlayer insulating layer 145 is formed on the control gate electrode 140. The interlayer insulating layer 145 may extend outside the first trench 115 to cover the blocking insulating layer 130. The interlayer insulating layer 145 may include an oxide layer and/or a nitride layer, for example. The interlayer insulating layer 145 may be formed using a CVD method.

Figure 11:
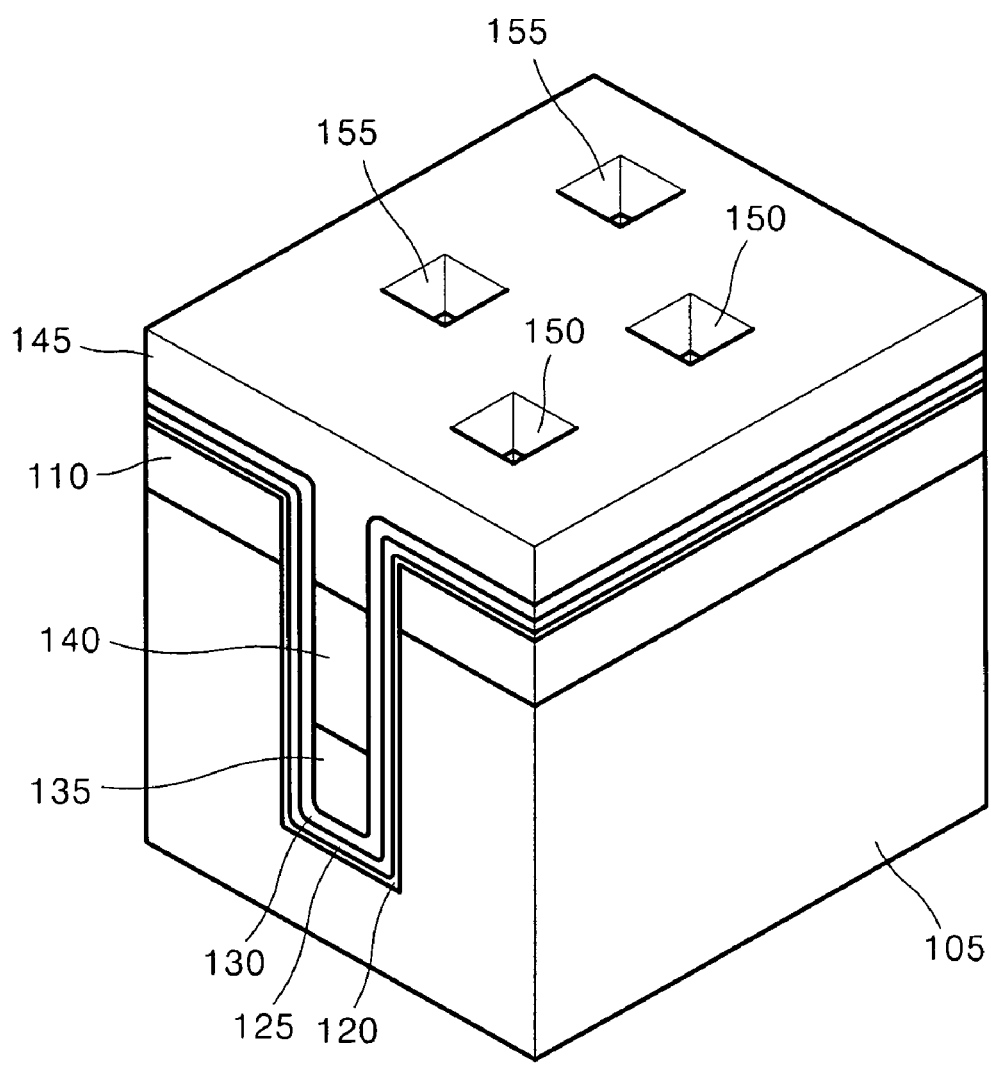

Referring to FIG. 11, a plurality of second trenches 150 are formed in the semiconductor substrate 105 along a first side of the control gate electrode 140, and a plurality of third trenches 155 are formed in the semiconductor substrate 105 along a second side of the control gate electrode 140. The third trenches 155 alternate with the second trenches 150 in the direction in which the control gate electrode 140 extends. The second and third trenches 150 and 155 may be formed at the same time or in a random sequence according to an example embodiment.

For example, the interlayer insulating layer 145, the blocking insulating layer 130, the storage node layer 125, the gate insulating layer 120, and the semiconductor substrate 105 may be sequentially etched to form the second and third trenches 150 and 155.

First dopant doping regions (refer to reference numeral 153 of FIG. 4) are formed in portions of a surface of the semiconductor substrate 105 exposed by the second trenches 150, and second dopant doping regions (refer to reference numeral 157 of FIG. 4) are formed in portions of the surface of the semiconductor substrate 105 exposed by the third trenches 155. For example, dopants may be doped into the exposed surface of the semiconductor substrate 105 to a desired and/or predetermined depth to define the first and second dopant regions in the semiconductor substrate 105. The dopants may be doped using an ion implantation method, for example. The first and second dopant doping regions may be formed at the same time or in a random sequence.

Figure 12:
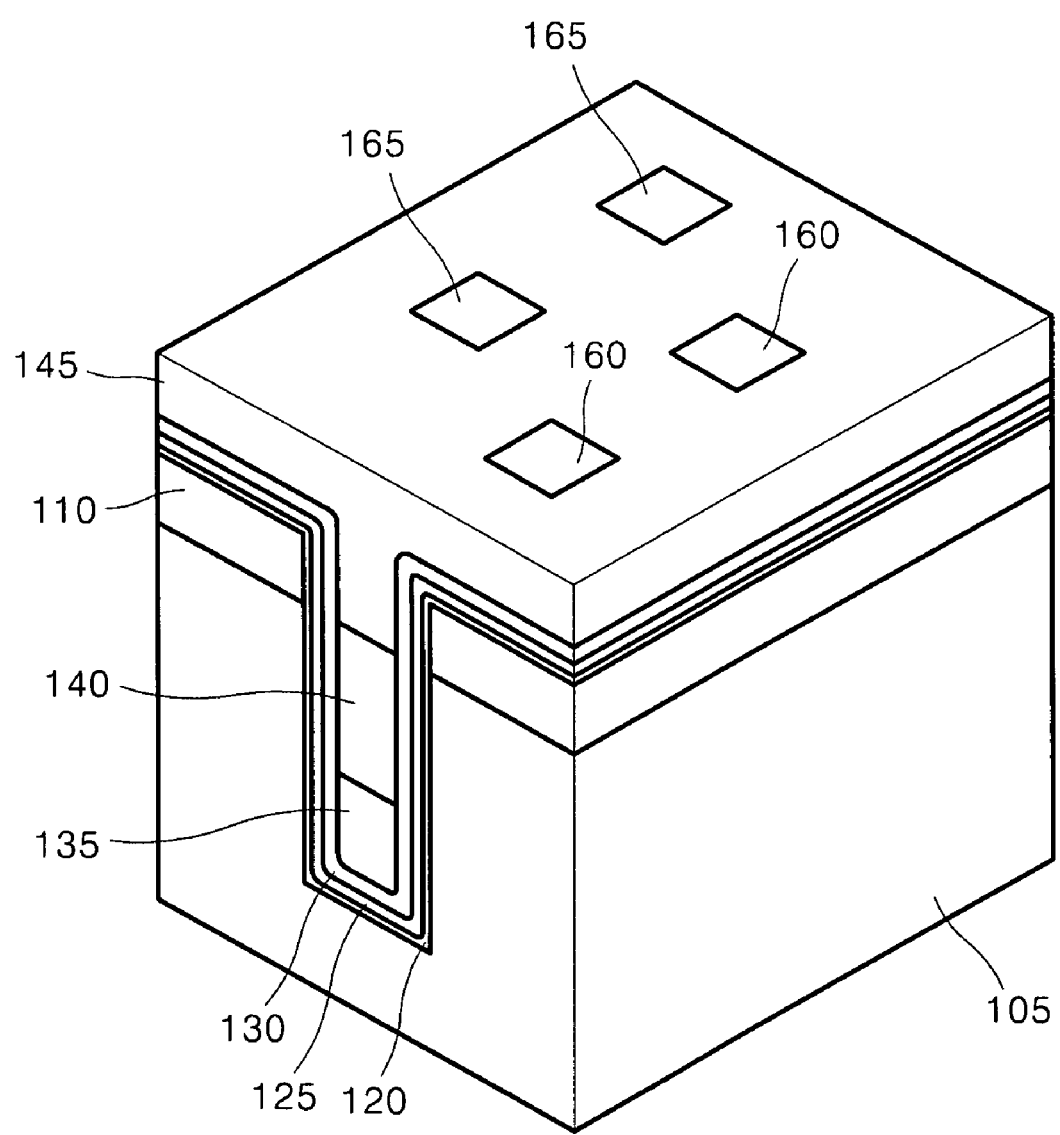

Referring to FIG. 12, a plurality of first plug portions 160 are formed to at least partially fill the second trenches 150, and a plurality of second plug portions 165 are formed to at least partially fill the third trenches 155. The first plug portions 160 may be recessed into the first dopant doping regions, and the second plug portions 165 may be recessed into the second dopant doping regions. For example, a conductive layer may be formed to fill the second and third trenches 150 and 155 and then planarized to form the first and second plug portions 160 and 165.

Figure 13:
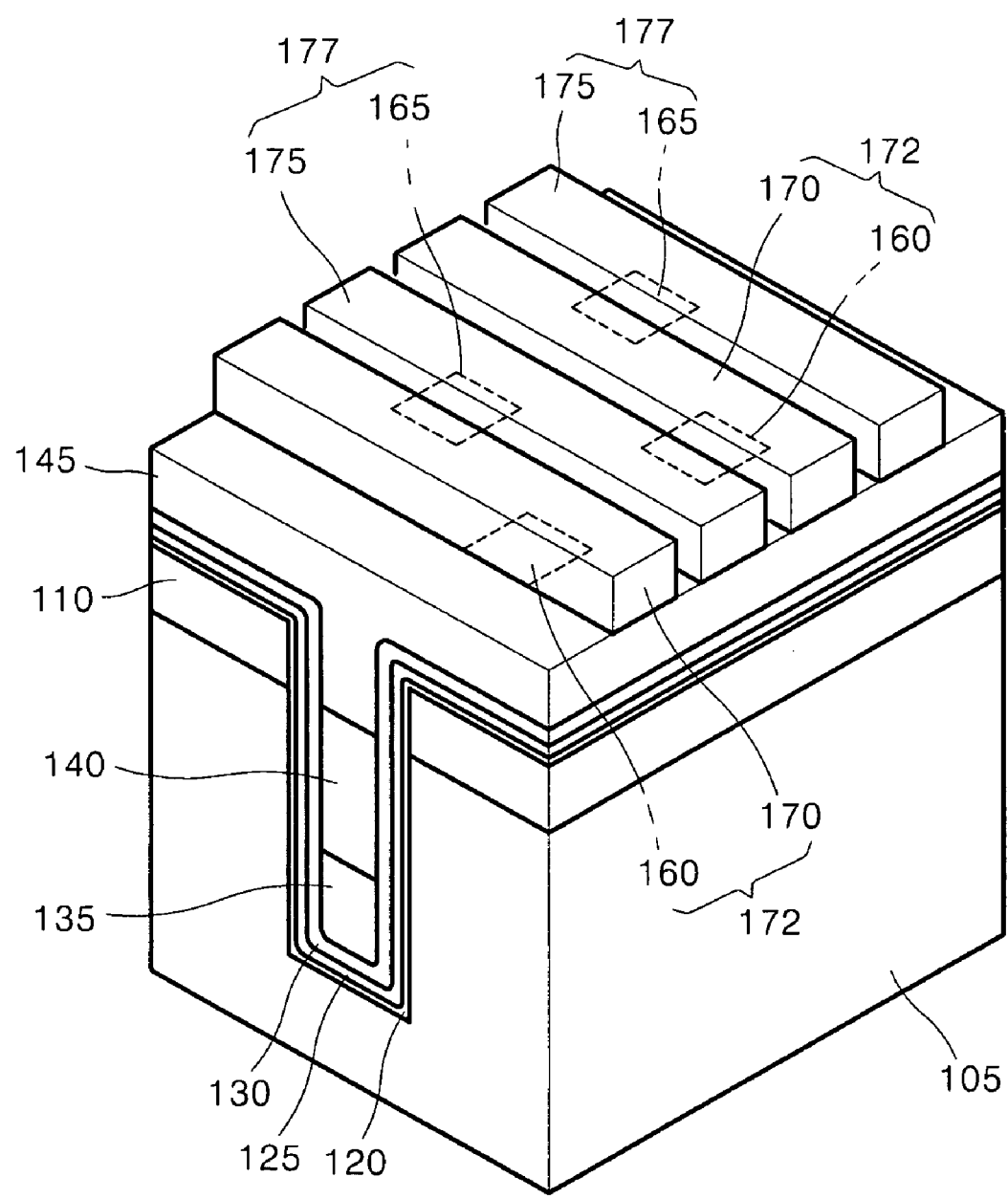

Referring to FIG. 13, a plurality of first line portions 170 are formed to be respectively connected to the first plug portions 160 and extend across the control gate electrode 140. A plurality of second line portions 175 are formed to be respectively connected to the second plug portions 165 and extend across the control gate electrode 140. First bit line electrodes 172 include the first plug portions 160 and the first line portions 170, and second bit line electrodes 177 include the second plug portions 165 and the second line portions 175.

According to another example embodiment, the first and second dopant doping regions 153 and 157 may be formed before the second and third trenches 150 and 155 illustrated in FIG. 11 are formed. In this case, the second and third trenches 150 and 155 may be formed to be defined in the first and second dopant doping regions.

According to still another example embodiment, the mask insulating layer 110 illustrated in FIG. 7 may be removed after the first trench 115 is formed. In this case, the gate insulating layer 120 illustrated in FIG. 8 may be formed in the first trench 115 and an upper surface of the semiconductor substrate 105.

According to another example embodiment, the process of forming the control gate electrode 140 may be repeated to form control gate electrodes (refer to reference numerals 140a and 140b of FIG. 5) having a multiple layer structure. For example, the process of forming the control gate electrode 140 may be repeated to form control gate electrodes having a two-layer structure as illustrated in FIG. 5. The control gate electrodes of the two-layer structure include a lower control gate electrode and an upper control gate electrode. In this case, an upper buried insulating layer 135b may be further formed on the lower control gate electrode before the upper control gate electrode is formed.

According to another example embodiment, the method described with reference to FIGS. 7 through 13 may be applied to the non-volatile memory device of FIG. 6.

As described above, in a non-volatile memory device and a method of fabricating the non-volatile memory device according to example embodiments, first dopant doping regions can alternate with second dopant doping regions beside opposite sides of a control gate electrode. Thus, integration of the non-volatile memory device according to example embodiment may be at least about twice that of a conventional non-volatile memory device.

Also, widths of first and second channel regions can be kept large. Thus, a short channel effect of example embodiments of a non-volatile memory device can be improved as compared with a conventional non-volatile memory device. As a result, reliability of the non-volatile memory device according to example embodiments can be improved as compared with a conventional non-volatile memory device.

Furthermore, example embodiments of a non-volatile memory device may include bit line electrodes having lower resistances than bit line electrodes of a conventional non-volatile memory device.

While example embodiments have been particularly shown in the drawings and described above, it will be understood by those of ordinary skill in the art that various changes in form and details may be made therein without departing from the spirit and scope of this disclosure.

What is claimed is:

1. A non-volatile memory device comprising:
   at least one first control gate electrode arranged on a semiconductor substrate;
   a gate insulating layer interposed between the semiconductor substrate and the at least one first control gate electrode;
   a storage node layer interposed between the gate insulating layer and the at least one first control gate electrode;
   a blocking insulating layer interposed between the storage node layer and the at least one first control gate electrode;
   a plurality of first dopant doping regions disposed along a first side of the at least one first control gate electrode;

a plurality of second dopant doping regions along a second side of the at least one first control gate electrode opposite to the first side;

a plurality of first channel regions adjacent to the first side of the at least one first control gate electrode and defined in portions of the semiconductor substrate between every two adjacent first dopant doping regions; and a plurality of second channel regions adjacent to the second side of the at least one first control gate electrode and defined in portions of the semiconductor substrate between every two adjacent second dopant doping regions.

2. The non-volatile memory device of claim 1, wherein the at least one first control gate electrode is recessed in the semiconductor substrate.

3. The non-volatile memory device of claim 1, wherein each of the plurality of second dopant doping regions are arranged in a region on the second side that is adjacent to at least one of the plurality of first dopant doping regions.

4. The non-volatile memory device of claim 1, wherein the plurality of first dopant regions and the plurality of second dopant doping regions are defined in the semiconductor substrate.

5. The non-volatile memory device of claim 1, further comprising:
a plurality of first bit line electrodes, each of the plurality of first bit line electrodes including at least one first plug portion recessed into one of the first dopant doping regions; and
a plurality of second bit line electrodes, each of the plurality of second bit line electrodes including at least one second plug portion recessed into one of the second dopant doping regions.

6. The non-volatile memory device of claim 5, wherein the first and second plug portions include at least one of polysilicon, metal, and metal silicide.

7. The non-volatile memory device of claim 5, wherein each of the plurality of first bit line electrodes further include at least one first line portion connected to the at least one first plug portion and extending across the at least one first control gate electrode.

8. The non-volatile memory device of claim 5, wherein each of the second bit line electrodes further include at least one second line portion connected to the at least one second plug portion and extending across the at least one first control gate electrode.

9. The non-volatile memory device of claim 1, further comprising a buried insulating layer interposed between a bottom of the at least one first control gate electrode and the semiconductor substrate, wherein the thickness of the buried insulating layer is greater than the thickness of the gate insulating layer.

10. The non-volatile memory device of clam 1, further comprising at least one second control gate electrode formed on the at least one first control gate electrode, wherein the second control gate electrode is insulated from the at least one first control gate electrode.

11. The non-volatile memory device of claim 1, wherein the storage node layer includes at least one of a silicon nitride layer, metal or silicon dots, and metal or silicon nano-crystals.

12. The non-volatile memory device of claim 1, wherein the blocking insulating layer includes at least one of an oxide layer, a nitride layer, and a high dielectric constant layer.

13. The non-volatile memory device of claim 1, wherein the at least one first gate electrode is a plurality of first gate electrodes.

* * * * *